United States Patent [19]

Tournier

[11] Patent Number: 5,217,944
[45] Date of Patent: Jun. 8, 1993

[54] CRYSTAL MAKING METHOD

[75] Inventor: Robert Tournier, Bilieu, France

[73] Assignee: Centre National de la Recherche Scientifique, Paris, France

[21] Appl. No.: 738,510

[22] Filed: Aug. 1, 1991

[30] Foreign Application Priority Data

Aug. 2, 1990 [FR] France .................... 90 10090

[51] Int. Cl.[5] .......................................... C30B 11/04
[52] U.S. Cl. ...................................... 505/1; 505/729; 156/600; 156/621; 156/624
[58] Field of Search .................. 156/600, 621, 624; 505/1, 729

[56] References Cited

U.S. PATENT DOCUMENTS

| | | | |
|---|---|---|---|
| 4,939,121 | 7/1990 | Rybka | 505/1 |
| 4,956,339 | 9/1990 | Yamazaki | 505/1 |
| 4,990,493 | 2/1991 | Lay | 505/1 |
| 5,039,653 | 8/1991 | Jackson et al. | 505/1 |

FOREIGN PATENT DOCUMENTS

| | | | |
|---|---|---|---|
| 0284534 | 10/1988 | European Pat. Off. | |
| 64-81127 | 3/1989 | Japan | 505/727 |
| 1-108156 | 4/1989 | Japan | |
| 2-7309 | 1/1990 | Japan | 505/727 |

OTHER PUBLICATIONS

"Control of Crystallization Processes by Means of Magnetic Fields", Journal of Crystal Growth, vol. 52, 1981, pp. 524–529, by Mikelson et al.
N.T.I.S. Technical Notes, No. 4, 1986, NASA Technical Brief "Damping Melt Convention with a Magnetic Field" 1986.

*Primary Examiner*—Robert Kunemund
*Attorney, Agent, or Firm*—Lowe, Price, LeBlanc & Becker

[57] ABSTRACT

A method for preparing a textured polycrystalline material having, in the crystalline state, a magnetic anisotropy, comprises the following steps:

preparing a compound such that, after being molten and solidified, it provides substantially only said material and that, at the melting temperature, crystallites of said material exist;

slowly heating close to the melting temperature, up to some degrees above said temperautre, so that it remains crystallites of said material in a liquid phase;

slowly cooling close to the melting temperature, up to solidification; and applying, at least from the time at which the material begins to enter the liquid state up to the time at which it is fully solidified, a magnetic field having a sufficient strength to preferentially orient, despite the thermal agitation energy, crystallites having a sufficient size for constituting crystallization seeds.

6 Claims, 2 Drawing Sheets

CRYSTAL MAKING METHOD

BACKGROUND OF THE INVENTION

The invention relates to a method for obtaining a crystallized material in presence of a magnetic field. It generally applies to any material presenting a magnetic anisotropy in the crystal state although it is more specifically disclosed hereinafter in connection with the manufacturing of high temperature superconducting materials such as materials of the RBaCuO family where R is a rare earth element such as yttrium.

Many authors have also indicated the possibility and the advantages of applying a magnetic field during sintering for improving the orientation or the size of crystalline grains to be obtained.

A part of the prior art documents relates to crystallization improvement when the material to be obtained is placed in an non-homogeneous medium. An example of such a prior art document is article of A. E. Mikelson and al. published in the Journal of Crystal Growth, 52, 1981, pages 524–529. In this article, it is taught that, if a magnetic field of about one tesla is applied to a cadmium-zinc alloy in the molten state, one obtains cadmium-zinc dendrites in an alloy having a different composition. These dendrites are oriented along the field lines.

In other articles, which more particularly deal with obtaining high temperature superconductors, it is suggested to make a superconductive ceramic by sintering and pressing, then annealing in presence of a field for improving the crystalline structure of the ceramic. So, in the European Patent Application 0 284 534, the first example relates to YbaCuO manufacturing and three successive annealing are disclosed, the first between 500° and 1200° C., for example 700° C., the second between 500° and 1200° C., for example 900° C., and the third between 600° and 1200° C., for example 800° C. So, in all the specific examples disclosed, although the temperature range indicated by the applicant reaches the melting temperature of YBaCuO (close to 1150° to 1200° C.), it is taught to stay below this temperature and no difference is made between what occurs below and above the melting temperature.

The present invention teaches a method comprising applying a magnetic field to a material during the crystallization or recrystallization, wherein this magnetic field is applied while the material is in a liquid phase and comprises crystallites liable to constitute crystallization seeds when cooling.

It will be shown that the implementation of such a method permits to obtain a polycrystalline composition wherein the grains are much better oriented than with the conventional methods and in particular when the field application is not made while the substance is in a liquid phase.

Before explaining in greater detail the invention, some general law of magnetism will be recalled.

Magnetic materials have a magnetic susceptibility $\chi$ which is generally anisotropic. For example, there are materials that have an axis of easy magnetization, hereinafter called axis c, the two other axes being axes a and b. Thus, if $\chi$ is the magnetic susceptibility, the difference in magnetic suspectibility between the axis of easy magnetization (c) and the hard magnetization directions (a and b), is:

$$\Delta\chi = \chi_c - \chi_{ab}$$

If a magnetic field B is applied, particles tend to be oriented according to their axis of easy magnetization and an energy gain $\Delta E$ is produced with respect to the case of a material with a random distribution of the magnetic axes:

$$\Delta E = V.B^2.\Delta\chi/2\mu_0$$

where V is the volume considered and $\mu_0 = 4\pi.10^{-7}$ in international units (I.U.).

If it is desired to orientate a magnetic material in a field, this energy gain $\Delta E$ must be substantially higher than the energy associated with the thermal agitation, namely, kT, where T is the absolute temperature and k the Boltzmann's constant.

The result of this comparison gives the definition of volumes or elementary domains liable to be satisfactorily oriented. For example, for a YBa$_2$Cu$_3$O$_7$ grain of 1 $\mu$m$^3$, which constitutes a high temperature superconductor, $\Delta\chi$ will be about $10^{-5}$ I.U. which gives $\Delta E/kT = 10^4$ at T = 1500° K. and for B = 5 teslas, that is, $\Delta E \geq kT$. But, $\Delta E/kT$ is equal to 10 only if the grain size decreases to $10^{-3}$ $\mu$m$^3$.

The simple case of an uniaxial anisotropy will be considered here. However, it is known that some magnetic materials may have several equivalent axes of easy magnetization and even an easy magnetization plane. This magnetic anisotropy may be very high when the material is magnetically ordered, particularly when it is ferromagnetic. In the paramagnetic state, the magnetic anisotropy is low but often sufficient for alignment under a magnetic field.

It will be reminded that the magnetic susceptibility $\chi$ varies with the inverse of the square temperature ($1/T^2$), that is $\chi$ decreases quickly when T increases.

SUMMARY OF THE INVENTION

The invention provides for a method for preparing a textured polycrystalline material having, in the crystalline state, a magnetic anisotropy, comprising the following steps: preparing a compound such that, after being molten and solidified, it provides substantially only said material and that, at the melting temperature, crystallites of said material exist; slowly heating close to the melting temperature, up to some degrees above said temperature, so that it remains crystallites of said material in a liquid phase; slowly cooling close to the melting temperature, up to solidification; and applying, at least from the time at which the material begins to enter the liquid state up to the time at which it is fully solidified, a magnetic field having a sufficient strength to preferentially orient, despite the thermal agitation energy, crystallites having a sufficient size for constituting crystallization seeds.

Between the heating and cooling steps, a step corresponding to a constant temperature level may be provided for.

According to an embodiment of the invention, said material is a high temperature superconductor.

According to an embodiment of the invention, said material is a superconductor of the RBaCuO type where R designates a rare earth element.

The invention, applies to the preparation of YBa$_2$Cu$_3$O$_7$. Then, said compound is a stoichiometric mixture of Y$_2$BaCuO$_5$, BaCuO$_2$ and CuO in the form of a pressed powder; the heating is carried out between 700° and 1040° C. with a temperature gradient of about 100°

C. per hour, the compound being maintained at 1040° C. for about two hours; and the cooling is carried out with a gradient of about 20° C. per hour. In a preferred embodiment, the magnetic field is applied as soon as the compound attains the temperature of about 700° C. and as long as it is above said temperature.

It will be appreciated that, according to a basic aspect of the invention, the heating step is carried out so that, at the beginning of the cooling step, there are crystallites of the material to be obtained having sizes adapted to constitute crystallization seeds.

This implies that the temperature at which the material is set above the melting temperature is not too high so that the sizes of the seeds do not become too small so that the magnetic field is operative on to those seeds. In other words, overheating has to be avoided.

This also implies that such seeds are initially present. Accordingly, in the process wherein the starting composition comprises a stoichiometric mixture of precursors of the material to be obtained, the temperature increases before the melting itself must be made with a sufficiently low temperature gradient so that such seeds are created.

This also implies, for example in the case where the starting material is already crystallized and has to be recrystallized, that the temperature increase must be high enough so that the crystallites having a too large size "melt" because, despite the presence of a liquid phase, such too big crystallites could be disturbed by their neighbours and prevent obtaining a satisfactory orientation.

Once a thermal process has been provided, so that, in the molten state, crystallites having suitable sizes are present, it will be necessary, in accordance with the above formulae, to choose a sufficient magnetic field strength for orienting such seeds despite thermal agitation phenomenons, that is the relation $\Delta E \geq kT$ has to be satisfied.

The invention will be disclosed hereinafter in connection with specific embodiments, but it will be understood that those skilled in the art, in view of the above criterions, will be able to implement the invention with any anisotropic magnetic material to be oriented and textured during a crystallization or recrystallization step.

The following description, for better emphasizing the conditions to be met, will indicate, on the one hand, results of experiments not strictly implementing the inventive methods and being unsuccessful, and, on the other hand, an example of an experience implementing the invention and providing a suitable grain texturation or orientation of a polycrystalline substance.

BRIEF DESCRIPTION OF THE DRAWINGS

This description will be made in connection with the attached drawings wherein.

DESCRIPTION OF THE PREFERRED EMBODIMENTS

Before disclosing the invention, preliminary experiments made by the inventors for illustrating the possibility of texturing a substance of the RBaCuO type in a molten heterogeneous medium in the presence of a magnetic field will be disclosed. Although, the considered materials are conventionally called here RBaCuO or $RBa_2Cu_3O_7$, the exact formula is $RBa_2Cu_3O_{7-\delta}$.

Figure 1:
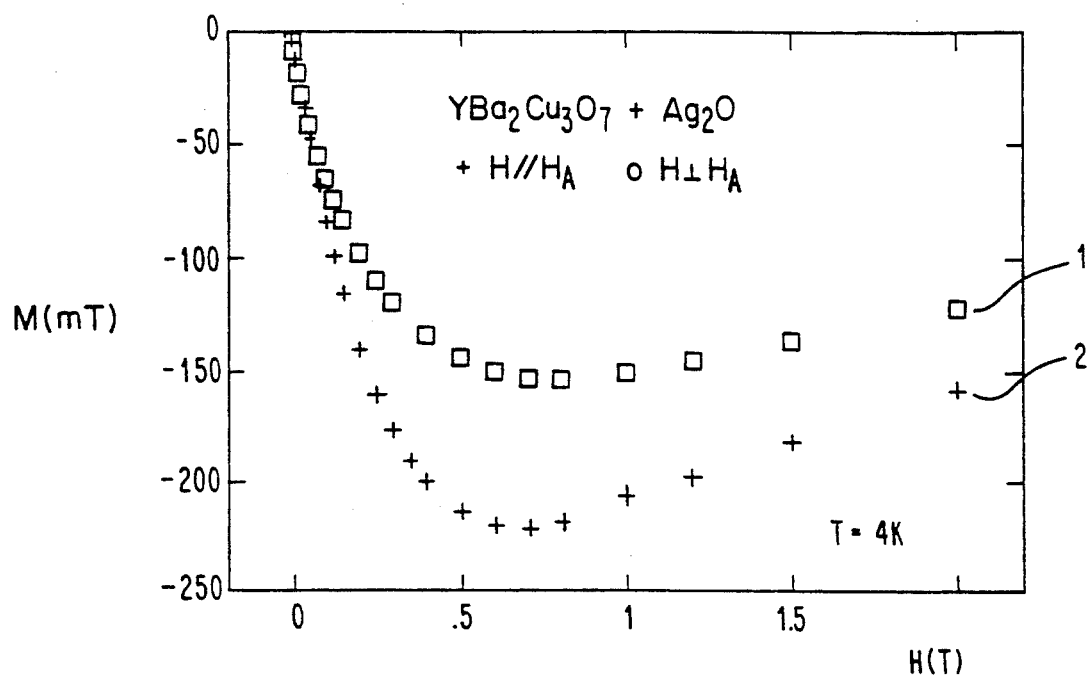
FIGS. 1 and 2 illustrate magnetization curves as a function of the field for high temperature superconductive materials in an heterogeneous medium.
Figure 2:
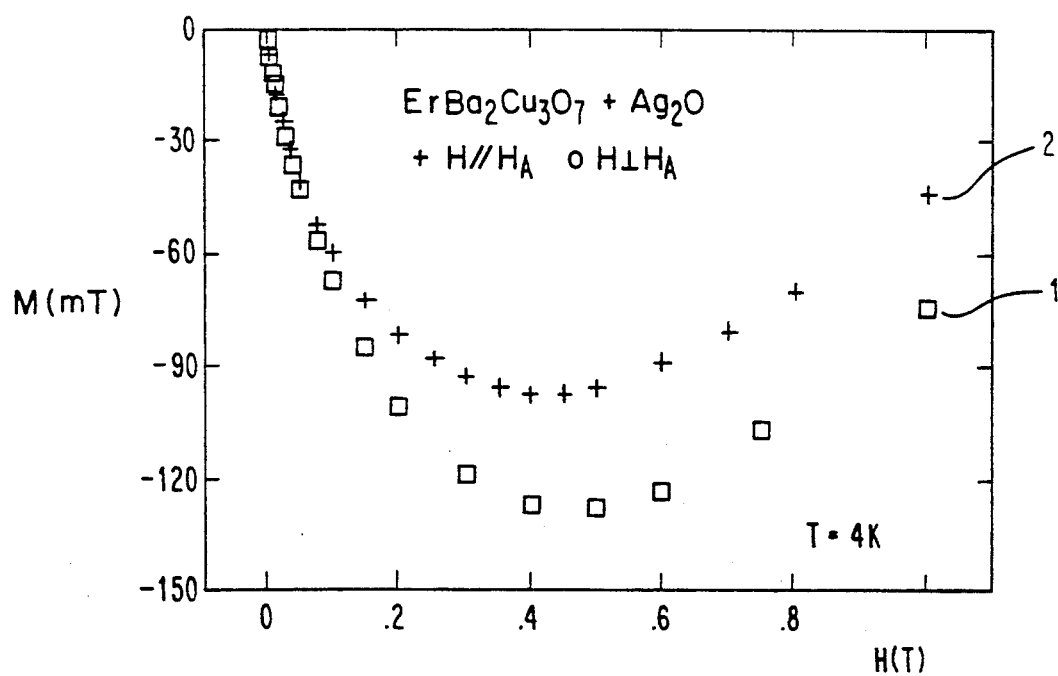

The applicant has submitted various powders of the $RBa_2Cu_3O_7$ type (where R designate a rare earth) mixed with a powder of silver oxide ($Ag_2O$), milled and sintered, to a thermal cycle up to a temperature close to the melting point of $RBa_2Cu_3O_7$. At such temperatures, $Ag_2O$ is a liquid. After a thermal cycle up to about 1020° C. and a cooling at a rate of some tens of degrees per hour, a texturation of the compound has been obtained, that is the $RBa_2Cu_3O_7$ grains contained in the compound are oriented along a preferential direction. More particularly, if the rare earth is yttrium, holmium, samarium or europium, the c axis of the crystalline structure of the crystallites is oriented parallel to the applied field because it is the axis of easy magnetization for those crystallites. However, if it is erbium, the c axis is oriented perpendicularly to the applied field because it is then an axis of hard magnetization while the (a, b) plane is a plane of easy magnetization. The occurrence of this anisotropy is illustrated by FIGS. 1 and 2 which respectively correspond to a mixture of $YBa_2Cu_3O_7$ and $Ag_2O$ and a mixture of $ErBa_2Cu_3O_7$ and $Ag_2O$. The curves of FIGS. 1 and 2 illustrate the magnetization M at 4° K as a function of the applied field H. In each figure, curve 1 corresponds to a measurement field perpendicular to the applied field $H_m$ during the cycle and curve 2 to a measurement field parallel to the field $H_m$ applied during the cycle. In those various cases, the fields $H_m$ were of some teslas. Those preliminary experiments show that, despite the decrease of the magnetic susceptibility $\chi$ with an increase of the temperature, it is possible for reasonable values of the field to cause an orientation of the $RBa_2Cu_3O_7$ crystallites in a liquid medium at temperatures as high as 1020° C.

In an example, $YBa_2Cu_3O_7$ has been prepared from three precursors $Y_2BaCuO_5$, $BaCuO_2$ and $CuO$ in stoichiometric proportions. It will be shown that, for permitting an orientation in a liquid phase, a suitable thermal sequence has to be used so that crystallites of the material to be obtained ($YBa_2Cu_3O_7$) of a suitable size exist in the liquid phase.

Figure 3:
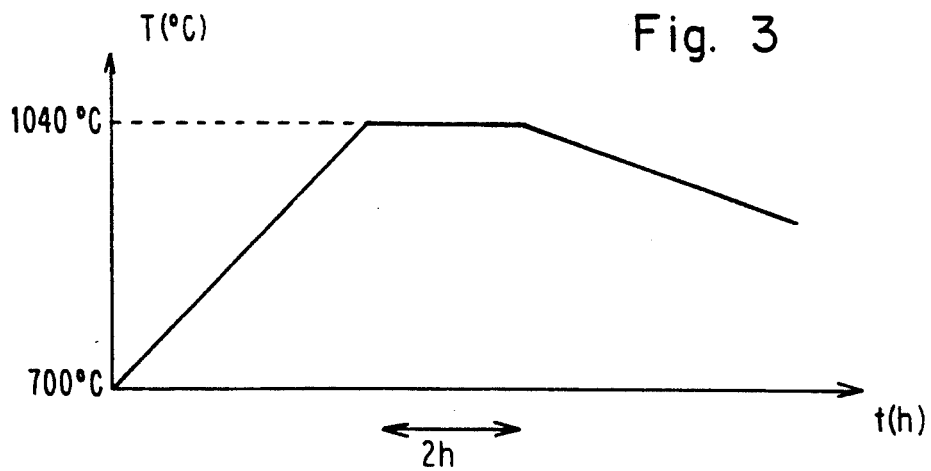
FIG. 3 shows a temperature diagram corresponding to the method according to the invention applied to an YBaCuO type material.
Figure 4:
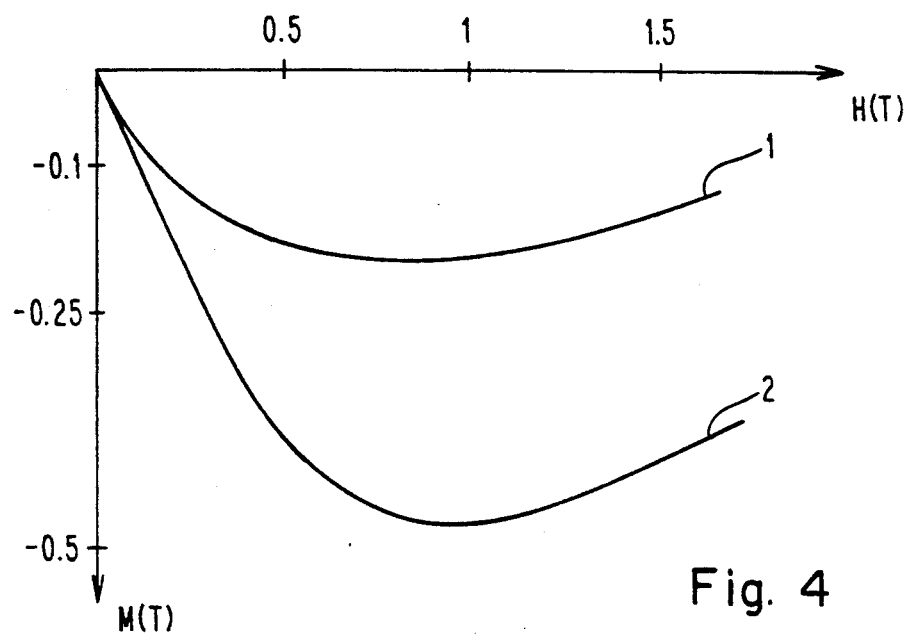
FIG. 4 shows a magnetization curve as a function of the field for an YBaCuO type material having been submitted to the inventive process.

The above indicated mixture, initially sintered, is used and the temperature is raised up to melting (1040° C.). This temperature increase has to be sufficiently slow so that the precursors react in a solid phase before melting to form crystallites (this normally occurs during a sintering operation). For example, the temperature increase rate can be about 100° C. per hour between 700° and 1040° C. Then, as shown in FIG. 3, the temperature is maintained at a constant level of 1040° C. during some hours, for example two hours. During the final phase of the temperature increase and during the constant temperature phase, a magnetic field of some teslas, for example 7T, is applied. Then, the temperature is slowly decreased, at a rate of some degrees per hour, for example 20° C. per hour. The magnetic field is maintained up to solidification and may be maintained below. So, as shown in FIG. 4, an $YBa_2Cu_3O_7$ ceramic having a quasi total anisotropy is obtained, that is a material the crystalline grains of which are oriented parallel to each other, the c axis being parallel to the magnetic field applied during the high temperature phase. The results indicated in FIG. 4 are clearly confirmed by X-ray analysis.

A similar experiment wherein the maximum temperature was 1050° C. and the field 5T produced an oriented $YBa_2Cu_3O_7$ ceramic (orientation slightly perturbed by non-homogeneities of the temperature in the crucible during the cooling) and with critical currents four times higher than in the former example.

Then, various experiences have been made by the inventors to show the limits of the process.

Figure 5:
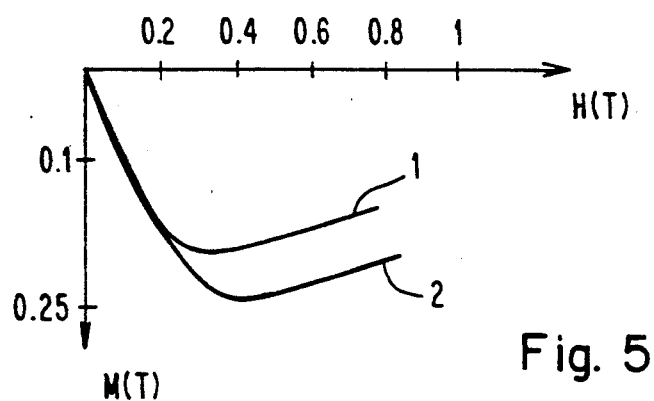
FIG. 5 shows a magnetization curve as a function of the field for an YBaCuO type material that has been placed at a temperature lower than its melting temperature.

FIG. 5 illustrates the result of an experiment made in the same conditions as in FIG. 3 but wherein the maximum temperature was 1020° C. The obtained $YBa_2Cu_3O_7$ had a low anisotropy because the liquid state had not been clearly attained.

With a constant temperature level of 1020° C. maintained during 24 hours, no X-ray detectable result is obtained.

A constant temperature level of 1030° C. also gave negative results.

In another experiment, the same cycle as the one of FIG. 3 has been conducted but the temperature increase rate was 200° C. per hour instead of 100° C. per hour and the maximum temperature was 1050° C. Then, the obtained $YBa_2Cu_3O_7$ was not textured in the direction of the magnetic field. In this experiment, the crystallites had not sufficient time to be formed in the solid phase at a sufficient size and, due to the high temperature of the liquid, the crystallites have been "dissolved" and had attained too small sizes to be usable as crystallization seeds.

Another experiment has been made wherein the maximum temperature was about 1055° C. Again, the obtained product did not exhibit an anisotropy associated with the presence of the magnetic field. In this case, due to the high temperature of the liquid phase (overheating), the crystallites had been, as formerly, "dissolved".

Consistent experiments have been made when starting from chemical precursors of $HoBa_2Cu_3O_7$ raised at their melting temperature.

As a conclusion, at least two conditions have to be taken into account for implementing the method according to the invention. The first condition is that seeds have to exist when the liquid phase occurs. The second condition is that such seeds have not to be eliminated by a too high temperature or a too high duration of the processing in the liquid phase.

Additionally, the applicant made experiments in accordance with the prior art techniques wherein the magnetic field is applied below the liquid phase temperature. Those experiments have not given any result as to a clear variation of the anisotropy of the obtained ceramic. At best, improvements of some percent (10–15%) (and not an anisotropy of substantially 100% as the one obtained by the present invention) have been observed.

The above discloses the results of experiments made by the applicant, mainly on high temperature superconductors of the $RBa_2Cu_3O_7$ type, and more particularly experiments wherein this high temperature superconductor was obtained from precursors in a stoichiometric mixture. The invention also applies when the starting material is directly the final material to be oriented if this material is heated over its melting temperature which is not the same as the one of the precursor mixture. For example, for $YBa_2Cu_3O_7$, the melting temperature is higher than 1050° C. instead of 1040° C. for the precursors mixture. The melting does not produce a liquid without solid seeds and, up to temperatures slightly higher than the melting temperature (some degrees, up to 10 to 15 degrees), crystallites liable to form seeds remain in the liquid and permit to implement the invention, or such seeds grow during the solidification process.

Additionally, other materials than the one indicated in the above examples can be textured (crystallographically oriented) by the method according to the invention in as much as such materials exhibit a magnetic anisotropy.

Additionally, it is known that, to facilitate the solidification of a material according to its preferential growth axis or plane, it is desirable to apply, during the cooling, a temperature gradient in the direction of this growth axis or plane. Particularly, this means that, during the solidification of a material, a temperature gradient can be applied along a direction corresponding to the growth direction already determined by the magnetic field applied according to the invention.

Thus, if we consider for example a rod or a wire of $YBa_2Cu_3O_7$ comprising a molten zone submitted to a magnetic field transverse to the rod direction, the longitudinal temperature gradient favorizes the texturation along the rod or wire.

I claim:

1. A method for preparing a textured polycrystalline material having, in the crystalline state, a magnetic anisotropy, comprising the following steps:

preparing a compound such that, after being molten and solidified, said compound provides substantially only said textured polycrystalline material and that, at a melting temperature, crystallites of said material exit;

slowly heating said compound from below said melting temperature, up to a second temperature slightly above said melting temperature at which crystallites of said material remain in a liquid phase;

slowly cooling said compound to cause solidification thereof; and applying, at least from a time at which the material begins to enter the liquid state up to a time at which it is fully solidified, a magnetic field having a sufficient strength to preferentially orient, despite the thermal agitation energy, crystallites of said material having a sufficient size for constituting crystallization seeds.

2. A method according to claim 1, further comprising maintaining said compound at a constant temperature level for a period of time between the heating and cooling steps.

3. A method according to claim 1, wherein said material is a high temperature superconductor.

4. A method according to claim 3, wherein said material is a superconductor of the RBaCuO type where R designates a rare earth element.

5. A method according to claim 4, for preparing $YBa_2Cu_3O_7$, wherein:

said compound is a stoichiometric mixture of $Y_2BaCuO_5$, $BaCuO_2$ and $CuO$ in the form of a pressed powder;

the heating is carried out between 700° and 1040° C. with a temperature gradient of about 100° C. per hour, the compound being maintained at 1040° C. for about two hours; and the cooling is carried out with a gradient of about 20° C. per hour.

6. A method according to claims 5, wherein said magnetic field is applied to said compound when said compound is heated to about 700° C. and the application of said magnetic field to said compound is maintained as long as the temperature of said compound remains above about 700° C.

* * * * *